(12) United States Patent
Kamath et al.

(10) Patent No.: US 9,898,805 B2
(45) Date of Patent: Feb. 20, 2018

(54) METHOD FOR EFFICIENT MEDIAN FILTERING

(71) Applicant: Texas Instruments Incorporated, Dallas, TX (US)

(72) Inventors: Sanmati S. Kamath, Plano, TX (US); Dipan Kumar Mandal, Bangalore (IN); Wonki Choi, Seongnam-si (KR)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1 day.

(21) Appl. No.: 15/040,424

(22) Filed: Feb. 10, 2016

(65) Prior Publication Data

US 2016/0232641 A1 Aug. 11, 2016

Related U.S. Application Data

(60) Provisional application No. 62/114,984, filed on Feb. 11, 2015.

(51) Int. Cl.
*G06K 9/40* (2006.01)
*G06T 5/00* (2006.01)
*G06T 5/20* (2006.01)
*G06F 17/18* (2006.01)
*H03H 17/02* (2006.01)

(52) U.S. Cl.
CPC .............. *G06T 5/00* (2013.01); *G06F 17/18* (2013.01); *G06T 5/20* (2013.01); *H03H 17/0261* (2013.01); *G06T 2200/28* (2013.01); *G06T 2207/20032* (2013.01)

(58) Field of Classification Search
CPC . G06F 17/18; G06T 1/20; G06T 5/002; G06T 5/00; G06T 2200/28; G06T 2207/20032
See application file for complete search history.

(56) References Cited

U.S. PATENT DOCUMENTS 6,058,405 A * 5/2000 Kolte ................. G06T 5/20
382/262

* cited by examiner

*Primary Examiner* — Duy M Dang
(74) *Attorney, Agent, or Firm* — Gregory J. Albin; Charles A. Brill; Frank D. Cimino

(57) ABSTRACT

A method is disclosed for efficiently calculating a median value of a high-order array in a Single Instruction Multiple Data (SIMD) processor. Values of the high-order array are sorted vertically in each column followed by sorts on each individual row. After the sort, selective diagonal values of the sorted high-order array are used to form a low-order array to calculate the median of the high-order array. The median calculation using selective diagonal values of the high-order array in a low-order array significantly improves SIMD processor efficiency and throughput.

14 Claims, 5 Drawing Sheets

SIGNAL DATA 120

| 123 | 77 | 182 | 202 | 81 | 18 | 215 | 151 | 167 |
|---|---|---|---|---|---|---|---|---|
| 2 | 94 | 14 | 18 | 195 | 220 | 254 | 31 | 133 |
| 249 | 65 | 243 | 216 | 202 | 238 | 248 | 76 | 113 |
| 74 | 166 | 40 | 195 | 204 | 114 | 252 | 39 | 64 |
| 92 | 41 | 52 | 225 | 48 | 91 | 191 | 163 | 206 |

FIRST 5X5 WINDOW

| 123 | 77 | 182 | 202 | 81 |
|---|---|---|---|---|
| 2 | 94 | 14 | 18 | 195 |
| 249 | 65 | 243 | 216 | 202 |
| 74 | 166 | 40 | 195 | 204 |
| 92 | 41 | 52 | 225 | 48 |

FIG. 1B

SECOND 5X5 WINDOW

| 77 | 182 | 202 | 81 | 18 |
|---|---|---|---|---|
| 94 | 14 | 18 | 195 | 220 |
| 65 | 243 | 216 | 202 | 238 |
| 166 | 40 | 195 | 204 | 114 |
| 41 | 52 | 225 | 48 | 91 |

FIG. 1C

THIRD 5X5 WINDOW

| 182 | 202 | 81 | 18 | 215 |
|---|---|---|---|---|
| 14 | 18 | 195 | 220 | 254 |
| 243 | 216 | 202 | 238 | 248 |
| 40 | 195 | 204 | 114 | 252 |
| 52 | 225 | 48 | 91 | 191 |

FIG. 1D

FOURTH 5X5 WINDOW

| 202 | 81 | 18 | 215 | 151 |
|---|---|---|---|---|
| 18 | 195 | 220 | 254 | 31 |
| 216 | 202 | 238 | 248 | 76 |
| 195 | 204 | 114 | 252 | 39 |
| 225 | 48 | 91 | 191 | 163 |

FIG. 1E

FIFTH 5X5 WINDOW

| 81 | 18 | 215 | 151 | 167 |
|---|---|---|---|---|
| 195 | 220 | 254 | 31 | 133 |
| 202 | 238 | 248 | 76 | 113 |
| 204 | 114 | 252 | 39 | 64 |
| 48 | 91 | 191 | 163 | 206 |

FIG. 1F

FIRST 5X5 WINDOW

| 123 | 77 | 182 | 202 | 81 |
|-----|----|-----|-----|-----|
| 2 | 94 | 14 | 18 | 195 |
| 249 | 65 | 243 | 216 | 202 |
| 74 | 166 | 40 | 195 | 204 |
| 92 | 41 | 52 | 225 | 48 |

COLUMN SORT

| 2 | 41 | 14 | 18 | 48 |
|---|----|----|----|-----|
| 74 | 65 | 40 | 195 | 81 |
| 92 | 77 | 52 | 202 | 195 |
| 123 | 94 | 182 | 216 | 202 |
| 249 | 166 | 243 | 225 | 204 |

ROW SORT

| 2 | 14 | 18 | 41 | 48 |
|---|----|----|----|-----|
| 40 | 65 | 74 | 81 | 195 |
| 52 | 77 | 92 | 195 | 202 |
| 94 | 123 | 182 | 202 | 216 |
| 166 | 204 | 225 | 243 | 249 |

VALUE SELECTION

| 2 | 14 | 18 | 41 | 48 |
|---|----|----|----|-----|
| 40 | 65 | 74 | 81 | 195 |
| 52 | 77 | 92 | 195 | 202 |
| 94 | 123 | 182 | 202 | 216 |
| 166 | 204 | 225 | 243 | 249 |

| 158 | 41 | 25 | 22 | 3 |
|---|---|---|---|---|
| 165 | 104 | 58 | 51 | 34 |
| 157 | 90 | 124 | 162 | 150 |
| 251 | 206 | 169 | 166 | 93 |
| 255 | 240 | 233 | 231 | 156 |

310

| 157 | 41 | 25 | 22 | 3 |
|---|---|---|---|---|
| 158 | 90 | 58 | 51 | 34 |
| 165 | 104 | 124 | 162 | 93 |
| 251 | 206 | 169 | 166 | 150 |
| 255 | 240 | 233 | 231 | 156 |

320

| 3 | 22 | 25 | 41 | 157 |
|---|---|---|---|---|
| 34 | 51 | 58 | 90 | 158 |
| 93 | 104 | 124 | 162 | 165 |
| 150 | 166 | 169 | 206 | 251 |
| 156 | 231 | 233 | 240 | 255 |

330

| DISTRIBUTED LOAD | 3 | 22 | 25 | 41 | 157 |
|---|---|---|---|---|---|
| DISTRIBUTED LOAD | 34 | 51 | 58 | 90 | 158 |
| DISTRIBUTED LOAD | 93 | 104 | 124 | 162 | 165 |
| DISTRIBUTED LOAD | 150 | 166 | 169 | 206 | 251 |
| NPT LOAD | 156 | 231 | 233 | 240 | 255 |

| ROW 0 | (0, 0) | (0, 1) | 25 | 41 | 157 |
| ROW 1 | (1, 0) | (1, 1) | 58 | 90 | 158 |
| ROW 2 | 93 | 104 | 124 | 162 | 165 |
| ROW 3 | 150 | 166 | 169 | 206 | 251 |
| ROW 4 | 156 | 231 | 233 | 240 | 255 |

360:

| (0, 3) | (0, 4) |  |
| (1, 2) | (1, 3) | (1, 4) |
| (2, 1) | (2, 2) | (2, 3) |
| (3, 0) | (3, 1) | (3, 2) |
|  | (4, 0) | (4, 1) |

370:

| 41 | 157 | SMALL X |
| 58 | 90 | 158 |
| 104 | 124 | 162 |
| 150 | 166 | 169 |
| LARGE X | 156 | 231 |

| (0, 3) | (0, 4) | (0, 2) |
| (1, 2) | (1, 3) | (1, 4) |
| (2, 1) | (2, 2) | (2, 3) |
| (3, 0) | (3, 1) | (3, 2) |
| (4, 2) | (4, 0) | (4, 1) |

390 (395):

| 41 | 90 | 25 (SMALL X) |
| 58 | 124 | 158 |
| 104 | 156 | 162 |
| 150 | 157 | 169 |
| 233 (LARGE X) | 166 | 231 |

FIG. 3C

METHOD FOR EFFICIENT MEDIAN FILTERING

CROSS-REFERENCE TO RELATED APPLICATIONS

This application claims priority to the U.S. provisional patent application Ser. No. 62/114,984, filed Feb. 11, 2015 the entirety of which is hereby incorporated herein by reference for all purposes.

TECHNICAL FIELD

This disclosure generally relates to the field of non-liner filtering and particularly to median filtering for image processing.

BACKGROUND

Generally, non-liner filtering is used in image processing to reduce noise and improve the signal and sharpness of images. The median filter is a form of nonlinear digital filtering technique, typically used to remove noise from images. Such noise reduction is a typical pre-processing step to improve results of an image. Median filtering preserves edges of images while removing noise. Median filtering is useful in reducing impulsive, or salt-and-pepper noise. It preserves edges in an image while reducing random noise. In median filtering processing, signal values are processed entry by entry and each entry is replaced by the median of neighboring entries. The pattern of neighbors is selected using a sliding 'window', which slides through each entry over the entire signal. For simple 1-D image signals, the sliding window captures first few preceding and following entries where for 2-D (or higher-dimensional) signals more complex window patterns are used such as for example, a box or cross patterns.

Various sizes of windows are used to process image values such as for example window sizes of 2×2, 3×3, 2×3, and the like. The median of a group of signal values within a window is calculated by sorting all the pixel values from the window into numerical order and then replacing the actual pixel value with the middle (median) pixel value and the median intensity value of the pixel becomes the output intensity of the pixel. Conventionally, all values in a given window are processed to calculate the median value of a given sliding window. To process all values of image signal in a given sliding window, even with vector processing, excessive amount of processing power is needed to identify a median value of each pixel in a window of pixel values. Further, processing all image signal values of a given window causes inefficiency in signal processing and reduces throughput.

SUMMARY

In accordance with an embodiment a method for determining median of an array is disclosed. The method includes sorting each column of a high-order array in ascending order to form a first sorted high-order array, sorting each row of the first sorted high-order array in ascending order to form a second sorted high-order array, selecting values from diagonal portion of the second sorted high-order array to form a low-order array, and calculating a median value of the low-order array as representing median value of the high-order array.

In accordance with another embodiment, a computer implemented method for determining a median value is disclosed. The method includes sorting, in parallel in a single instruction multiple data (SIMD) processor, each column of a five-by-five (5×5) array in ascending order to form a first sorted 5×5 array, sorting, in parallel in the SIMD processor, each row of the first sorted 5×5 array in ascending order to form a second sorted 5×5 array, forming a five-by-three (5×3) array using values selected from diagonal cells of the second sorted 5×5 array and cells that are horizontally and vertically adjacent to the diagonal cells in the second sorted 5×5 array, calculating a median of the 5×3 array as a median value of the 5×5 array.

In accordance with another embodiment, a method for calculating a median value of pixels in a Single Instruction Multiple Data (SIMD) processor is disclosed. The method includes sorting in parallel each column of a first array of pixel values in ascending order to form a first sorted array of pixel values, transpose storing the first sorted array of pixel values in the SIMD, sorting in parallel each row of the first sorted array of pixels values in ascending order to form a second sorted array of pixels, transpose storing the second sorted array of pixel values in the SIMD, forming a second array of pixel values using values selected from diagonal cells of the second sorted array of pixel values and cells that are horizontally and vertically adjacent to the diagonal cells in the second array of pixel values, and calculating a median value of the second array of pixel values as a median value of the first array of pixel values.

BRIEF DESCRIPTION OF THE DRAWINGS

FIGS. 1A-F illustrate an exemplary method for 5×5 median filtering using a sliding window for a data set of pixel values according to an embodiment.

FIGS. 2A-D illustrate an exemplary implementation of median filtering for 5×5 matrix/array according to an embodiment illustrates an exemplary according to some embodiment.

FIGS. 3A-C illustrate another exemplary implementation of median filtering for a 5×5 array according to another embodiment.

DETAILED DESCRIPTION

Figure 4:
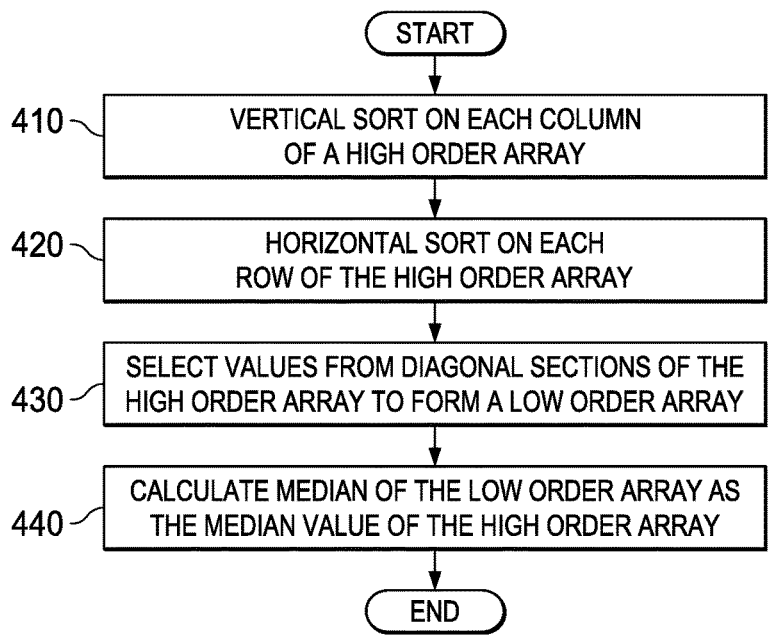
FIG. 4 illustrates a flow chart of a process for determining median value for a high order array according to another embodiment.

The following description provides many different embodiments, or examples, for implementing different features of the subject matter. These descriptions are merely for illustrative purposes and do not limit the scope of the invention.

A system and method is disclosed for efficiently calculating a median value of an array of values in an array of any size A×B, where A is the number of rows and B is number of columns in the array. The numbers A×B can be any value such as 3×5, 5×5, 7×7, 5×7 and other similar arrays of data value. In the exemplary embodiment, median is calculated for values in a 5×5 array; however, any size of array can be used to calculate median using the exemplary embodiment. The values can be any number such as integers, floating point, or other types of numbers. The values in exemplary 5×5 array are sorted vertically in each column followed by sorts on each individual row. After the sorts, selective diagonal values are used to calculate the median of the 5×5 array. The median calculation using selective diagonal values of 5×5 array significantly improves processing efficiency and throughput particularly, in vector processors such as Single Instruction Multiple Data (SIMD) processors.

Referring to FIG. 1, an exemplary method for 5×5 median filtering using a sliding window for a data set 110 of values is illustrated according to an embodiment. FIG. 1A is the set of data 110 representing signal values for example, pixel values of an image. The data set 110 can be stored in any form of memory for example, in an array of memory locations in a processor or external memory storage. While for explanation purposes, the exemplary data set 110 includes 5 rows and 9 columns of data; however, the data set 110 can be of any size for example, the data set 110 can be an entire page of image memory defining an image including pixel values of the image. Further, the data set 110 can be spread over multiple memory pages defining a continuous image for example, a digital video stream or the like. A sliding window 120 defines a 5×5 matrix/array for median calculation. The sliding window 120 can be memory pointers identifying memory locations to be included for median calculations. The terms matrix and array are used interchangeably in this disclosure to refer to a set of data arranged in columns and rows of various sizes. The memory pointers can be part of any register or similar structures that track memory locations for a 5×5 array. Further, the sliding window can also be implemented using shift registers in a given system such as a general purpose processor or SIMD processor.

In the exemplary implementation of FIG. 1, the sliding window 120 is shown to move from left of the data set 110 to the right by one column at a time; however, the window sliding is not limited in one direction for example, if the data set 110 includes an entire memory page then the sliding window 120 can start from any location in the memory page and move in any direction to calculate median for each pixel value. As stated herein, the median value of a pixel is calculated using values of neighboring pixels. In the case of a 5×5 matrix/array, the median value of a given pixel is calculated using values of 24 of its neighbor pixels.

FIG. 1B illustrates the first 5×5 matrix/array for median calculation and as the sliding window moves from left to right of the data set 110 by each column, a new 5×5 matrix/array is defined for each pixel as illustrated in FIGS. 1B-E. Similarly, when the data set 110 is a page of memory with a memory array of M×N, then the sliding window 120 can move in any direction to define a different matrix/array for each selected pixel to calculate a median value for the pixel.

Referring to FIG. 2, an exemplary implementation of median filtering for 5×5 array 210 is illustrated according to an embodiment. In FIG. 2A, the array 210 is similar to the one illustrated in FIG. 1B as an example; however, any 5×5 data array can be used to determine median filter for pixel values. Initially, each column of array 210 is sorted from top to bottom using the ascending values resulting in the array 220 as illustrated in FIG. 2B. The vertical or column sort on all values can be conducted in a SIMD lane. In SIMD, the sort can be carried out over 5 rows worth of data. The result of this sort can then be written to memory of SIMD as a transposition, so that the next step can still perform SIMD wide accesses to the original data.

The sorted array 220 is then further sorted using each row in ascending order resulting in array 230 illustrated in FIG. 2C. This sort can also be carried out over 5 rows worth of data and the results are yet again written out as transposed values to the memory. Typically, in vector or SIMD processors (e.g., Texas Instruments' Embedded Vision Engine) eight values can be transpose stored in a single cycle. After this step the values in array 230 are ordered in ascending order in both the vertical and horizontal directions.

The array 230 can then be used to identify a subset of pixel values for median calculation for example, the values in the three diagonal cells as highlighted in array 240 illustrated in FIG. 2D and indicated by arrows 250, 260, and 270 can be used to calculate the median value for the pixel. Although, limited pixel values are selected from the original 5×5 array for median calculation, it results in the same median value as explained below.

The original array 210 includes 25 values as follows:
123, 77, 182, 202, 81, 2, 94, 14, 18, 195, 249, 65, 243, 216, 202, 74, 166, 40, 195, 204, 92, 41, 52, 225, 48

Sorting these 25 values in ascending order results in:
2, 14, 18, 40, 41, 48, 52, 65, 74, 77, 81, 92, <u>94</u>, 123, 166, 182, 195, 195, 202, 202, 204, 216, 225, 243, 249

As illustrated above, the sorting of these values results in '94' as the median value for the 5×5 array 210 including 25 values.

According to an embodiment, when diagonal values as illustrated in matric 240 are used for median calculation, it results in the following 13 values:
94, 166, 77, 123, 204, 74, 92, 182, 41, 81, 195, 48, 195

Sorting these 13 values in ascending order results in:
41, 48, 74, 77, 81, 92, <u>94</u>, 123, 166, 182, 195, 195, 204, As illustrated above, the sorting of these values results in '94' as the median value for the 5×5 array 210 using only 13 diagonal values. By sorting 5×5 array column wise, row wise, and then selectively choosing diagonal values of the array results in the same median value for the pixel; however, this approach uses less processing cycles in a processor thus significantly increasing the processor efficiency and throughput. Processors that process data for image processing, constantly calculate median values for each pixel in a given image to create a sharper image. According to an embodiment, the throughput of these processor can be improved significantly for image processing.

According to another embodiment, the processing for median calculation can be further improved by identifying a maximum value in diagonal cells indicated by arrow 250, identifying a median value of diagonal cells indicated by arrow 260, and identifying minimum value in diagonal cells indicated by arrow 270. This results in the same median value as illustrated below:

Maximum value of diagonal cells indicated by arrow 250: 94
Median value of diagonal cells indicated by arrow 260: 92
Minimum value of diagonal cells indicated by arrow 270: 182
Taking median of three values, 92, 94, and 182 results in the same median <u>94</u> as explained hereinabove.

Various embodiments of present disclosure can be implemented in different signal processors such as for example, scalar processors, SIMD processors, and the like. Implementation in SIMD processor can result in significant improvement of clock cycle utilization.

Referring to FIGS. 3A-C, another exemplary implementation of median filtering for a 5×5 array 310 is illustrated according to another embodiment. The data in array 310 is sorted for each column as explained herein and results in sorted array 320. The array 320 is then sorted for each row and results in sorted array 330. As explained herein, when 13 diagonal values are used to determine the median, it results in:
41, 58, 90, 104, 124, 150, <u>156</u>, 157, 158, 162, 166, 169, 231
The true median of above values is given as 156.

To implement the embodiment in any given SIMD or vector process, the diagonal values identified in the previous steps can then be formed into a 5×3 array. The 5×3 array can be loaded in a SIMD processor as distributed load in certain patterns in SIMD lanes as illustrated in 340 in FIG. 3A to obtain the correct diagonal elements for the 5×3 array. After the distributed load, on a vector processor core (e.g., SIMD processor), the loaded array is illustrated in 350. Here, values from three diagonal sections of the array are used to calculate the median value and as can be seen, the 5×3 array will be short two elements as illustrated in array 360. In the 5×3 array 360, two additional elements are needed to make the array vectorizable for any given vector or SIMD processor for parallel processing. This enables operating median processing in a SIMD processor using a 5×3 array.

The new elements are added as the head/tail of the array 360 and do not skew the result or lead to erroneous median result. For example, adding a lower or lowest value in the first row of array 360, which is lower than the lowest value of the diagonal values selected from array 340 as head value and a higher or highest value in the fifth row of array 340 than the highest value of the selected diagonal values as tail value or visa-versa, keeps the median value calculation same and does not skew the calculation as illustrated in array 370. By selecting the lower value as the head value and higher value as the tail value, the array load for the vector processor can be as illustrated in array 380 and the values are illustrated in the resulting array 390 where 25 is selected as the head value and 233 is selected as the tail value. While two specific values are illustrated; however, any lower value from the first row and higher value from the last row can be selected to complete the 5×3 array without skewing the results of median calculation.

As explained in the present example, the head value refers to the value in the first row, third column and the tail value refers to the last row and the first column of the array. The distributed load is a feature that some parallel processors (e.g., Texas Instruments' Embedded Vector Engine) include, which allows them to load a vector array (multiple input elements) out-of-order. This means that lanes of the vector register in the parallel or SIMD processors can hold any element from the load buffer in any order.

The 5×3 array then can be used to determine the median by first sorting the array column wise resulting in sorted 5×3 array 390. These sorts can also carried out over 5 rows worth of data in a SIMD processor in parallel and the results can be written out as transposed values in the memory. The median can be calculated as:
Median (pixel(1,2); pixel(2,2); pixel(3,1)) gives the true median.
Middle of elements (158, 156, 150)=156—true median as illustrated by dashed circle 395.

Referring to FIG. 4, a flow chart of a process for determining median value for a high order array is illustrated according to an embodiment. Initially, the high order array is sorted vertically at 410 in ascending order for example at each column. The vertical sort can be performed in parallel in a vector or SIMD processor. At 420, the high order array is sorted horizontally at each row in ascending order. At 430, values from diagonal cells of the high order array are selected to form a low order array. The number of selected diagonal cells from high order array will depend on the size of the low order array. For example, if the high order array is a 5×5 array and the low order array is a 5×3 array, then cells from three middle diagonals are selected to form 5×3 array. Similarly, diagonal cells can be selected from a 7×7 array to form a 5×5 or 3×3 array. At 440, a median of low order array is calculated to determine the median of the high order array. Using the embodiments described herein, the processing efficiency and throughput of signal processors such as vector processors, array processors (SIMD) and similar other processor can be improved significantly specifically, when processing an image where each value in array represents a pixel value of the image and a median filter needs to be calculated for sharper image.

Figure 5:
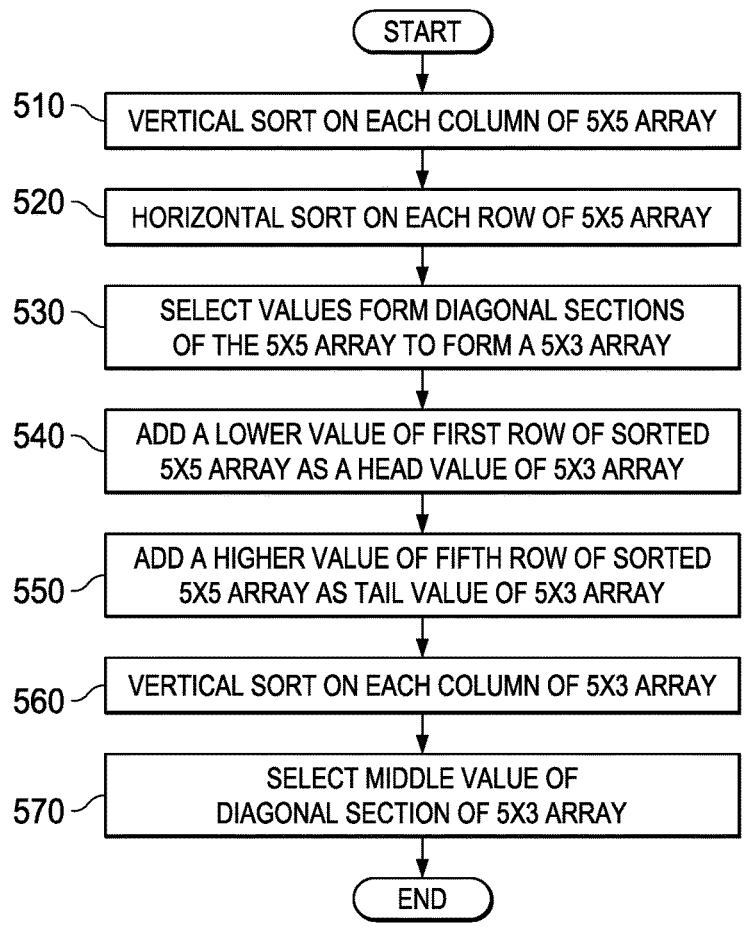
FIG. 5 illustrates a flow chart of a process for determining a median value of a 5×5 array according to yet another embodiment.

Referring to FIG. 5, a flow chart of a process for determining a median value of a 5×5 array is illustrated according to an embodiment. Initially, the 5×5 array is sorted vertically at 510 for example each column is sorted in ascending order. Each column of the 5×5 array can be sorted in parallel in a vector or SIMD processor. At 520, the 5×5 array is sorted horizontally at each row in ascending order as explained herein. At 530, values from diagonal cells of 5×5 array are selected to form a 5×3 array. In the present example, cells from three middle diagonals are selected to form a 5×3 array such as illustrated in FIG. 3.

At 540 and 550, a lower (or lowest) value from the first row of the sorted 5×5 array is used as a head value for the 5×3 array and a higher (or highest) value from the fifth row of sorted 5×5 array is used a tail value for the 5×3 array respectively to form a complete 5×3 array. Similarly, for a higher order array, additional values can be selected from sorted array to form a lower order array. Selecting equal number of lowest and highest values do not skew the calculation of median. At 560, the 5×3 array is sorted vertically in each column in parallel in ascending order. At 570, the diagonal values of the sorted 5×3 array are used to determine the median for the original 5×5 array. In another embodiment, the middle value of diagonal values of the sorted 5×3 array will represent the median for the 5×5 array.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims. Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for determining a median of an array comprising:
   sorting each column of a high-order array in ascending order to form a first sorted high-order array;
   sorting each row of the first sorted high-order array in ascending order to form a second sorted high-order array;
   selecting values from diagonal portion of the second sorted high-order array to form a low-order array;
   sorting each column of the low-order array in ascending order to form a first sorted low-order array; and
   selecting a middle value from the diagonal portion of the second sorted low-order array as a median value for the high-order array.

2. The method of claim 1, wherein each one of the first sorted high-order array, the second sorted high-order array, the first sorted low-order array, and the second sorted low-order array are stored in a memory of a Single Instruction Multiple Data (SIMD) processor as a transposition.

3. The method of claim 1, wherein each sorting is done in parallel in a Single Instruction Multiple Data (SIMD) processor.

4. The method of claim 1, wherein selecting the values from the diagonal portion of the second sorted high-order array includes:
   selecting at least one low value from a first row of the second sorted high-order array as at least one head value of the low-order array; and
   selecting at least one high value from a last row of the second sorted high-order array as at least one tail value of the low-order array.

5. The method of claim 4, wherein
   the low value is a value lower than a lowest value of the values from the diagonal portion of the second sorted high-order array, and
   the high value is a value higher than a highest value of the values from the diagonal portion of the second sorted high-order array.

6. The method of claim 1, wherein
   the high-order array is a 5×5 array has five rows and five columns, and
   the low-order array is a 5×3 array has five rows and three columns.

7. A computer implemented method for determining a median value comprising:
   sorting, in parallel in a single instruction multiple data (SIMD) processor, each column of a five-by-five (5×5) array in ascending order to form a first sorted 5×5 array;
   sorting, in parallel in the SIMD processor, each row of the first sorted 5×5 array in ascending order to form a second sorted 5×5 array;
   forming a five-by-three (5×3) array using values selected from diagonal cells of the second sorted 5×5 array and cells that are horizontally and vertically adjacent to the diagonal cells in the second sorted 5×5 array;
   sorting each column of the 5×3 array in ascending order to form a first sorted 5×3 array; and
   selecting a middle value from a diagonal portion of the second sorted 5×3 array as a median value for the 5×5 array.

8. The method of claim 7, wherein each one of the first sorted 5×5 array, the second sorted 5×5 array, the first sorted 5×3 array, and the second sorted 5×3 array are stored in a memory of the SIMD processor as transposition.

9. The method of claim 7, wherein forming the 5×3 array includes:
   selecting at least one low value from a first row of the second sorted 5×5 array as at least one head value of the 5×3 array; and
   selecting at least one high value from a last row of the second sorted 5×5 array as at least one tail value of the 5×3 array.

10. The method of claim 9, wherein
    the low value is a value lower than a lowest value of the values from a diagonal portion of the second sorted 5×5 array, and
    the high value is a value higher than a highest value of the values from the diagonal portion of the second sorted 5×5 array.

11. The method of claim 7, wherein
    the 5×5 array has five columns and five rows, and
    the 5×3 array has five rows and three columns.

12. A method for calculating a median value of pixels in a Single Instruction Multiple Data (SIMD) processor comprising:
    sorting in parallel each column of a first array of pixel values in ascending order to form a first sorted array of pixel values;
    transpose storing the first sorted array of pixel values in the SIMD;
    sorting in parallel each row of the first sorted array of pixels values in ascending order to form a second sorted array of pixels;
    transpose storing the second sorted array of pixel values in the SIMD;
    forming a second array of pixel values using values selected from diagonal cells of the second sorted array of pixel values and cells that are horizontally and vertically adjacent to the diagonal cells in the second array of pixel values;
    sorting in parallel each column of the second array of pixel values in ascending order to form a third array of pixel values;
    transpose storing the third array of pixel values in the SIMD; and
    selecting a middle value from a diagonal portion of the fourth array of pixel values as a median value for the first array of pixel values.

13. The method of claim 12, wherein the forming of the second array of pixel values includes:

distributed loading pixel values of the second array of pixel values in a vector array of the SIMD processor;

loading at least one low value from a first row of the second sorted array of pixel values as at least one head value of the second array of pixel values in the vector array of the SIMD; and loading at least one high value from a last row of the second sorted array of pixel values as at least one tail value of the second array of pixel values in the vector array of the SIMD.

14. The method of claim 13, wherein the low value is a value lower than a lowest value of the values from a diagonal portion of the second sorted array of pixel values, and the high value is a value higher than a highest value of the values from the diagonal portion of the second sorted array of pixel values.

\* \* \* \* \*